(12) United States Patent
Chuang

(10) Patent No.: US 7,030,497 B2
(45) Date of Patent: Apr. 18, 2006

(54) LOCALIZED SLOTS FOR STRESS RELIEVE IN COPPER

(75) Inventor: Harry Chuang, Austin, TX (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 84 days.

(21) Appl. No.: 10/845,887

(22) Filed: May 14, 2004

(65) Prior Publication Data
US 2004/0214424 A1    Oct. 28, 2004

Related U.S. Application Data

(63) Continuation-in-part of application No. 10/017,955, filed on Dec. 14, 2001, now Pat. No. 6,828,223.

(51) Int. Cl.
*H01L 29/40*    (2006.01)
(52) U.S. Cl. ...................... 257/774; 257/734
(58) Field of Classification Search ............ 257/734, 257/774
See application file for complete search history.

(56) References Cited

U.S. PATENT DOCUMENTS 6,642,597 B1 *  11/2003  Burke et al. ................ 257/459

* cited by examiner

*Primary Examiner*—Roy Potter
(74) *Attorney, Agent, or Firm*—Thomas, Kayden, Horstemeyer & Risley

(57) ABSTRACT

In accordance with the objectives of the invention a new method is provided for the creation of interconnect metal. Current industry practice is to uniformly add slots to wide and long copper interconnect lines, this to achieve improved CMP results. These slots, typically having a width in excess of 3 μm and having a length in excess of 3 μm, are added to interconnect lines having a width that is equal to or in excess of 12 μm. This approach however does not, due to its lack of selectivity of location of the slots, solve problems of localized stress that are associated with isolated single vias in the metal lines. For this reason, the invention provides for the addition of one or more localized slots adjacent to isolated vias in bottom or top metal lines that are no wider than about 2 microns.

20 Claims, 2 Drawing Sheets

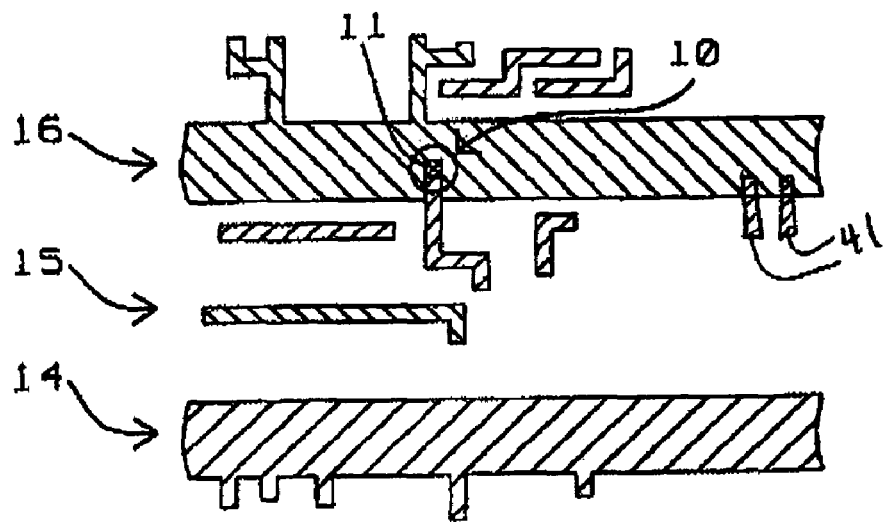
FIG. 1a – Prior Art
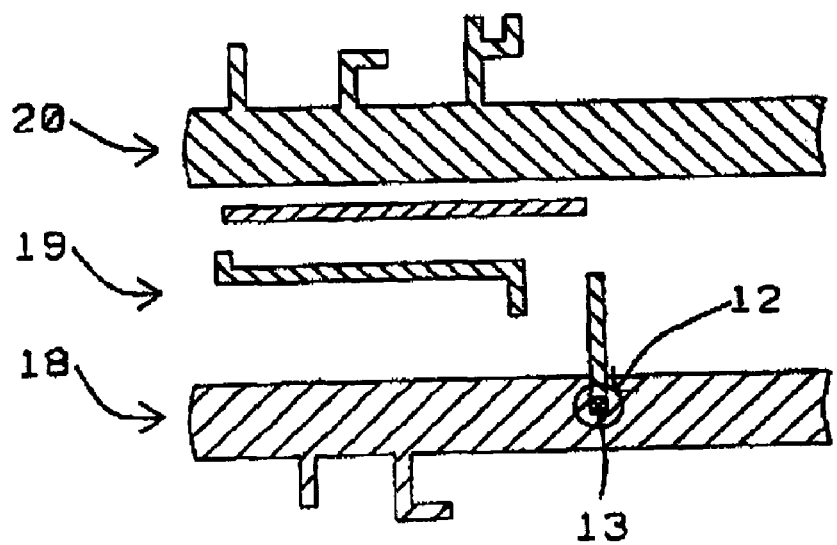
FIG. 1b – Prior Art

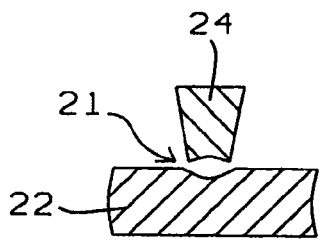
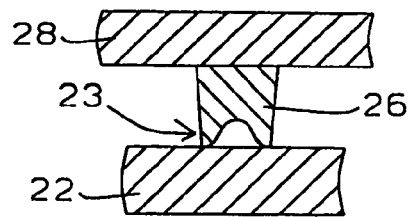
FIG. 2a – Prior Art
FIG. 2b – Prior Art
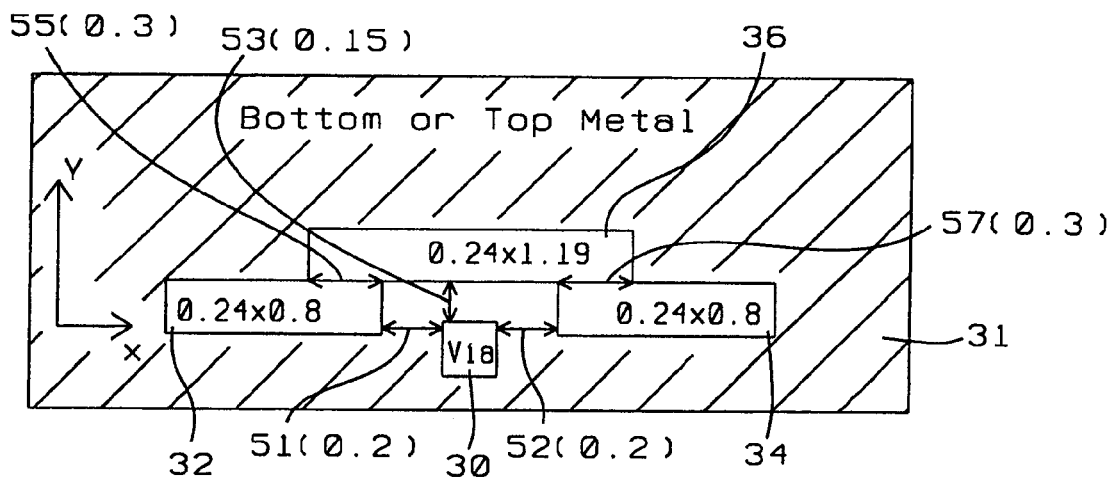
FIG. 3
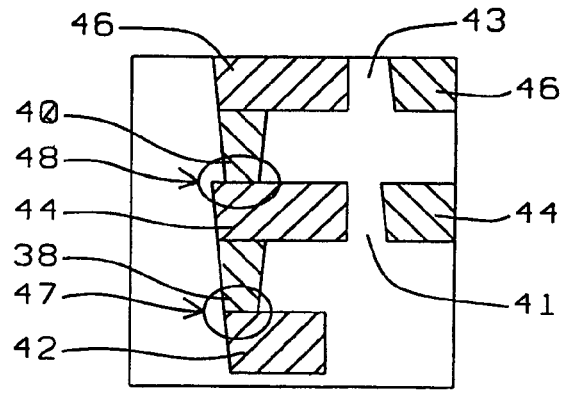
FIG. 4

LOCALIZED SLOTS FOR STRESS RELIEVE IN COPPER

This patent application is a continuation in part of U.S. patent application Ser. No. 10/017,955, filed on Dec. 14, 2001 now U.S. Pat. No. 6,828,223.

BACKGROUND OF THE INVENTION (1) Field of the Invention

The invention relates to the fabrication of integrated circuit devices, and more particularly, to a method of avoiding stress introduced failures in copper metallization.

(2) Description of the Prior Art

Continued reduction in semiconductor device features brings with it continued shrinkage of the widths of interconnect metal in integrated circuits in order to reduce the electrical conductivity of the wiring material. Because of this aluminum, which has been the material of choice since the integrated circuit art began, is becoming less attractive than other, low-resistivity conductors such as copper, gold, and silver. These materials, in addition to their superior electrical conductivity, are also more resistant than aluminum to electromigration, a quality that grows in importance as wire width decreases. These low-resistivity metals however also suffer from a number of disadvantages, such as low diffusion rates and the formation of undesirable inter-metallic alloys and/or recombination centers in other parts of the integrated circuit. Copper has the additional disadvantage of being readily oxidized at relatively low temperatures. Nevertheless, copper is seen as an attractive replacement for aluminum because of its low cost and ease of processing so that the prior and current art has tended to concentrate on finding ways to overcome the limitations that are associated with low-resistivity interconnect materials such as copper.

Materials that are considered for application in the creation of interconnect wire are of aluminum, tungsten, titanium, copper, polysilicon, polycide or alloys of these metals. For comparative purposes the conductivity of copper can be cited as being $6 \times 10^7$ $\Omega^{-1} m^{-1}$ while typical conductivity of polymers is in the range from between about $10^{-8}$ to $10^7$ Siemen/meter (S/m). As an example, polyacetylene has an electrical conductivity in excess of $4 \times 10^7$ $\Omega^{-1} m^{-1}$, which approaches the conductivity of copper of $6 \times 10^7$ $\Omega^{-1} m^{-1}$.

Copper has a relatively low cost and low resistivity, it also however has a relatively large diffusion coefficient into silicon dioxide and silicon. Copper from an interconnect may diffuse into the silicon dioxide layer causing the dielectric to be conductive, decreasing the dielectric strength of the silicon dioxide layer. Copper interconnects are therefore typically encapsulated by at least one diffusion barrier for the prevention of copper diffusion into surrounding dielectric layers. Silicon nitride is a known diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate.

While copper has become important for the creation of multilevel interconnections, copper lines frequently show damage after chemical mechanical polishing (CMP) and clean. This in turn causes problems with planarization of subsequent layers that are deposited over the copper lines since these layers may now be deposited on a surface of poor planarity. Isolated copper lines or copper lines that are adjacent to open fields are susceptible to damage. While the root causes for these damages are at this time not clearly understood, poor copper gap fill together with subsequent problems of etching and planarization are suspected. Where over-polish is required, the problem of damaged copper lines becomes even more severe.

The above brief summary has highlighted some of the advantages and disadvantages of using copper as in interconnect metal. Continued improvement in semiconductor device performance requires continued reduction of device features and device interconnect lines. This continued reduction in the cross section of interconnect lines results in new stress patterns within the interconnect lines. The invention addresses the application of copper interconnect lines where these interconnect lines are part of overlying layers of interconnect metal that are connected by vias between adjacent layers of copper traces. The vias make contact to overlying or underlying layers of patterned copper interconnections. Where these patterned copper interconnection comprise relatively wide interconnect lines, these wide interconnect line tend to exert a relatively large force on the thereto connected copper vias. This large force, caused by internal stress in the wide interconnect lines, is a cause for poor and unreliable interfaces between the copper vias and the thereto connected wide interconnect lines. The invention addresses this concern and provides a method whereby stress related failures in the interface between copper vias and adjacent and therewith connected wide copper interconnect lines is eliminated.

SUMMARY OF THE INVENTION

A principle objective of the invention is to create stress-free interconnect metal of copper.

Another objective of the invention is to eliminate the occurrence of stress in copper interconnect vias by creating slots in interconnect metal traces that are selectively located with respect to the copper interconnect via.

Yet another objective of the invention is to eliminate the occurrence of localized stress migration problems in interconnect metal lines having a width of 2 to 3 microns that are connected to isolated, single vias.

Yet another objective of the invention is to create copper interconnect lines of improved polishing performance.

In accordance with the objectives of the invention a new method is provided for the creation of interconnect metal. Current industry practice is to uniformly add slots to wide and long copper interconnect lines, this to achieve improved CMP results. These slots, typically having a width in excess of 3 μm and having a length in excess of 3 μm, are added to interconnect lines having a width that is equal to or larger than 12 μm. This approach however does not, due to its lack of selectivity of the location of the slots, solve problems of localized stress that are associated with isolated single vias connecting to the metal lines. For this reason, the invention provides for the addition of one or more localized slots adjacent to isolated vias that are connected to bottom or top metal lines that are no wider than about 2 microns.

U.S. Pat. No. 6,146,025 shows a method of applying a laser diode and substrate.

U.S. Pat. No. 6,140,700 shows a semiconductor chip package and a method of creating this package.

U.S. Pat. No. 5,920,118 shows a chip-size semiconductor package.

BRIEF DESCRIPTION OF THE DRAWINGS

FIGS. 1a and 1b show a top view of two levels of interconnect metal with failing interconnect vias.

FIGS. 2a and 2b show the failure mode of interconnect vias that typically interconnect overlying layers of wide interconnect traces.

FIG. 3 shows a top view of an interconnect via and surrounding slots that are provided by the invention in wide overlying layers of interconnect metal.

FIG. 4 shows a cross section of a first and a second via which interconnect overlying layers of metal traces after the implementation of slots surrounding the interconnect vias in layers of overlying layers of wide interconnect metal. No failures are present in the interfaces between the vias and the adjacent layers of wide interconnect metal.

DESCRIPTION OF THE PREFERRED EMBODIMENTS

The reliability of a metal interconnect is most commonly described by a lifetime experiment on a set of lines to obtain the medium time to failure. The stress experiment involves stressing the lines at high current densities and at elevated temperatures. The failure criterion is typically an electrical open for non-barrier conductors or a predetermined increase in line resistance for barrier metallization.

The mean time to failure is dependent on the line geometry where this failure is directly proportional to the line width and the line thickness. Experimentally, it has been shown that the width dependence is a function of the ratio of the grain size "d" of the film and the width "w" of the conductor. As the ratio "w/d" decreases, the mean time to failure will increase due to the bamboo effect.

Some of the problems encountered in depositing thin interconnect lines where these lines contain copper, are (1) poor adhesion qualities of copper to silicon dioxide, (3) the tendency of copper to readily diffuse through dielectric materials such as silicon dioxide under certain process conditions and contaminate an underlying silicon region, and (3) the resistance of copper to traditional dry-etching patterning methods (RIE or plasma etch, and (4) the occurrence of localized areas of stress in the copper interconnect that result in reliability concerns. The invention addresses the latter concern by providing a method that results in stress relieve in copper interconnect metal depositions.

Conventional methods proposed for placing copper conductors on silicon based substrates are based on the deposition of a variety of layers where each layer has characteristics of performance or deposition that enhance the use of copper as the major component within conducting lines. This approach has met with limited success and has as yet not resulted in the large-scale adaptation of copper. The present invention circumvents these disadvantages by teaching a method of copper line deposition that solves previous deposition problems by a structural stress reducing approach.

Low resistivity metals such as aluminum and copper and their binary and ternary alloys have been widely explored as fine line interconnects in semiconductor manufacturing. Typical examples of fine line interconnect metals include $Al_xCu_y$, where the sum of x and y is equal to one and both x and y are greater than or equal to zero and less than or equal to one, ternary alloys such as Al—Pd—Cu and Al—Pd—Nb, and other similar low resistivity metal-based alloys. Emphasis on scaling down line width dimensions in very large scale integrated (VLSI) circuitry manufacturing has led to reliability problems including inadequate isolation, electromigration, and planarization. Damascene processes using metal filling vias and lines followed by chemical mechanical polishing (CMP) with various Al, Cu and Cu-based alloys are a key element of future wiring technologies for very large-scale system integration (VLSI). A key problem is filling high aspect ratio vias and lines without voids or seams, and creating homogeneous structures. A number of methods are being considered to addresses this problem such as Metallo-Organic Chemical Vapor Deposition (MOCVD), laser melting, high temperature bias sputtering (i.e. above 450 degrees C.) technique has been attempted but this technique has limitations below 1 µm geometries. Further, low resistivity copper lines are being evaluated for back-end metallization and packaging applications. However, good fill of these alloys in submicron lines is still challenging as the existing techniques mentioned above lack adequate filling properties.

Referring now specifically to FIGS. 1a and 1b, there are shown two top views of a layer of interconnect metal, the layer of interconnect metal has been created over a semiconductor surface (not shown) such as the surface of a dielectric, with, for FIG. 1a:

14 and 16, layers of wide interconnect metal; 14 is a first layer of interconnect metal (M1), 16 is a second layer of interconnect metal (M2)

15, interconnect metal patterned for interconnection of the two layers 14 and 16 of wide interconnect metal 11, a via underlying layer 16 of wide interconnect metal; the layer 14 of M1 is connected to layer 16 of M2 by means of via 11

10, the area of interface between the via 11 and the wide interconnect metal 16 where a failure mode occurs; the nature of this failure mode will be highlighted using FIGS. 2a and 2b.

41, close-together vias that are separated from isolated single via 11. These vias 41 are not addressed by the invention.

It is clear from the top view of interconnect metal that is shown in FIG. 1a that the via 11 is surrounded by overlying interconnect metal of wide interconnect line 16. Any stress that occurs in wide interconnect line 16 will therefore be directly transferred to via 11. For instance, if an upward stress is introduced in wide interconnect line 16, it stands to reason that this upward stress will tend to pull the underlying via 11 in an upward direction.

Similar comments apply to the top view that is shown in FIG. 1b, as follows:

18 and 20, layers of wide interconnect metal; 18 is a first layer of interconnect metal (M1), 20 is a second layer of interconnect metal (M2)

19, interconnect metal patterned for interconnection of the two layers 18 and 20 of wide interconnect metal 13, a via overlying layer 18 of wide interconnect metal; the layer 18 of M1 is connected to layer 20 of M2 by means of via 13

12, the area of interface between the via 13 and the wide interconnect metal 20 where a failure mode occurs; the nature of this failure mode will be highlighted using FIGS. 2a and 2b.

The failure modes that have been identified in the regions 10 and 12 of FIGS. 1a and 1b respectively are shown in detail in the cross sections of FIGS. 2a and 2b, specifically:

FIG. 2a shows a cross section of the failure mode that is identified as a via hump 21, which is created in the interface between the via 24 and the underlying layer 22 of wide bottom metal due to internal stress in the wide bottom metal layer 22.

FIG. 2b shows a cross section of the failure mode that is identified as a via pullback 23, which is created in the interface between the via 26 and the underlying layer 22 of wide bottom metal due to the internal stress of the wide top metal layer 28.

Both of the failures modes, 21 and 23, are created to undue stress that is exerted by wide layers of metal either underneath or overlying the via. The via is created in order to interconnect overlying layers of patterned interconnect metal.

The solution that is provided to the above highlighted problem of via interconnect failure is shown in top view in FIG. 3, which specifically highlights slots that are provided in the layer of metal to which a single, isolated via is connected. Specifically highlighted in FIG. 3 are:

30, a single, isolated interconnect via such as via 11 (FIG. 1a) or via 13 (FIG. 1b). Note that in FIG. 1a, the single via 11 is isolated from other vias such as close-together vias 41. Vias 41 are not isolated from each other.

31, a layer of metal, either metal underlying (bottom metal) or overlying (top metal) an interconnect via; layer 31 is assumed to be a layer of wide interconnect metal, such as layers 16 (an overlying layer of interconnect metal, FIG. 1a) or layer 18 (an underlying layer of interconnect metal, FIG. 1b) which have previously been highlighted as causing the via hump problem (FIG. 2b) or the via pullback problem (FIG. 2b)

32, a first slot portion adjacent to the interconnect via 30; typical dimensions for first slot portion 32 are 0.24×0.8 $\mu m^2$ 34, a second slot portion adjacent to the interconnect via 30; typical dimensions for second slot portion 34 are 0.24×0.8 $\mu m^2$, and 36, a third slot portion adjacent to the interconnect via 30; typical dimensions for third slot portion 36 are 0.24×1.19 $\mu m^2$.

The relative location of the first, second and third slot portions that surround interconnect via 30 have been identified as follows:

51, is a first distance in an X-direction between the first slot portion 32 and the via 30, this first distance is about 0.2 $\mu m$ 52, is a second distance in an X-direction between the second slot portion 34 and the via 30, this second distance is about 0.2 $\mu m$, and 53, is a third distance in an Y-direction between the third slot portion 36 and the via 30, this third distance is about 0.15 $\mu m$ 55, the distance over which slot portion 32 is in contact with slot portion 36, this distance is about 0.3 $\mu m$ 57, the distance over which slot portion 34 is in contact with slot portion 36, this distance is about 0.3 $\mu m$.

Where slot portions 32, 34 and 36 have been shown in the top view of FIG. 3 as rectangles, the invention is not limited to these slot portions being rectangles but is equally valid if these slot portions are created as squares. Dimensions other than the dimensions that have been shown in FIG. 3 would apply for square slot portions 32, 34 and 36.

It must be realized that the invention is not limited to the exact application of the first, second and third slot portions as they have been highlighted in the top view of FIG. 3. Any advantageous combination of these slot portions may be applied whereby all or only part of these slot portions are used for the achievement of the stated objectives of the invention.

From the top view that is shown in FIG. 3, representing a number of slots that surround the surface area of a first or a second layer of wide interconnect metal where this surface area intersects with an interconnect via, it is clear that surface tension that is present in a first or a second layer of wide interconnect metal is dissipated in the first or the second layer of wide interconnect metal and therefore has no influence on the via interconnect where this via interconnect makes contact with the first or the second layer of wide interconnect metal. This means that via interconnect failures, as these failures have been highlighted in FIGS. 2a and 2b, will no longer occur, significantly enhancing via interconnect reliability and, ultimately, device reliability.

FIG. 4 shows a cross section of two interconnect vias, specifically:

42, a metal contact point provided in a semiconductor surface (not shown); interconnects are to be made between metal contact point 42 and overlying layers of patterned interconnect metal 44, a first layer of overlying interconnect metal; this layer is assumed to be a layer of wide interconnect metal 46, a second layer of overlying interconnect metal; this layer is assumed to be a layer of wide interconnect metal 38, a first interconnect via, which connects contact point 42 with the first layer 44 of wide interconnect metal 40, a second interconnect via, which connects first layer 44 of wide interconnect metal with the second layer 46 of wide interconnect metal 41, a first slot that has been created in the first layer 44 of wide interconnect metal, adjacent to first interconnect via 38; this first slot is one of the slot portions 32, 34 or 36 that have been highlighted in top view in FIG. 3

43, a second slot that has been created in the second layer 46 of wide interconnect metal, adjacent to second interconnect via 40; this second slot is one of the slot portions 32, 34 or 36 that have been highlighted in top view in FIG. 3.

It must be remembered relating to the cross section that is shown in FIG. 4 that this cross section is a pictorial representation of an actual cross section. In this respect, areas that have been highlighted as areas 47 and 48 take on significant meaning since these sub-sections of the cross section of FIG. 4 highlight respectively the interface between metal contact point 42 and the first via 47 and the interface between the first layer of wide interconnect metal 44 and the second via 40. It is clear from the cross section that is shown in FIG. 4 that the previously experienced problems of reliability of the interface surfaces, as detailed using FIGS. 2a and 2b, have been eliminated for reasons that have been explained in detail above.

While special attention has been dedicated to the interfaces that have been highlighted as regions 47 and 48 in the cross section of FIG. 4, it must be noted from the cross section that is shown in FIG. 4 that the interface between the first via 38 and the first layer 44 of metal, and the interface between the second via 40 and the second layer 46 of metal are equally well created and show no deviation from an ideal, flat and well-connected interface. By providing the slot of the invention, as highlighted in top view in FIG. 3, the cross section of FIG. 4 shows that all related interfaces between overlying vias and layers of wide interconnect metal have been created free of reliability concerns. By implementing slots in a layer of wide interconnect metal, these slots may be advantageously implemented in ways other than the exact method that is shown in top view in FIG. 3. Variations of the concept, of providing a single slot in the vicinity of the interface between interconnect via and patterned layer of wide interconnect metal, can readily be derived and can be optimally created following the same concept for special applications.

To summarize the invention:
the invention applies to single, isolated vias separated from other vias that connect elsewhere to copper lines
the invention applies to single, isolated vias that interconnect overlying layers of wide interconnect metal
wide interconnect metal is understood to be interconnect metal having a width of about 2 µm or less
a first, a second, a third slot portion or a combination thereof to form a single slot is created in a layer of wide interconnect metal in a surface area of the wide interconnect metal that is adjacent to the interface between the wide interconnect metal and a thereto connecting via
the location of the first, a second, a third slot portion or a combination thereof to form a single slot with respect to the single, isolated via is defined and known but can be modified in order to achieve the stated objectives of the invention, and
the invention applies to interconnect metal that comprises copper.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

The invention claimed is:

1. An integrated circuit device comprising:
a first copper line over a substrate;
an insulating layer overlying said first copper line; and
a copper interconnect to said first copper line through an opening in said insulating layer wherein said copper interconnect comprises a single isolated via isolated from other vias formed through said insulating layer elsewhere on said substrate and an overlying second copper line wherein a slot in at least one of said first and second copper lines adjacent to said single isolated via provides stress relief at interfaces between said single isolated via and said first copper line and between said single isolated via and said second copper line.

2. The device according to claim 1 further comprising:
a dielectric layer overlying said substrate and underlying said first copper line wherein an electrical contact lies in or on said substrate; and
a first copper via through said dielectric layer connecting said electrical contact and said first copper line wherein said first copper via is isolated from other vias formed through said dielectric layer elsewhere in said substrate and wherein said slot is formed at least in said first copper line adjacent to said first copper via.

3. The device according to claim 1 wherein said slot in said first copper line provides stress relief at the interface of said first copper via and said first copper line.

4. The method according to claim 1 wherein said first and second copper lines have a width of more than about 0.2 µm.

5. The method according to claim 1 wherein said slot comprises:
a first slot portion spaced a first distance from said single isolated via in an X-direction;
a second slot portion spaced a second distance from said single isolated via in an X-direction opposite from said X-direction of said first slot portion and having a same first Y-direction placement relative to said single isolated via as said first slot portion; and
a third slot portion spaced a third distance from said single isolated via in a second Y-direction placement different from said first Y-direction placement wherein said third slot portion contacts a section of said first slot portion and a section of said second slot portion thereby forming a single said slot.

6. The method according to claim 5 wherein said first, second, and third slot portions have a rectangular or square shape.

7. The method according to claim 5 wherein a section of said first slot portion contacted by said third slot has a length defined by a fourth distance and wherein a section of said second slot portion contacted by said third slot has a length defined by a fifth distance.

8. The method according to claim 5 wherein said first distance is between about 0.1 and 0.4 µm, said second distance is between about 0.1 and 0.4 µm, and said third distance is between about 0.05 and 0.3 µm.

9. The method according to claim 7 wherein said fourth distance is between about 0.1 and 0.5 µm and said fifth distance is between about 0.1 and 0.5 µm.

10. The method according to claim 5 wherein said first slot portion has dimensions of between about 0.1 and 0.5 µm by between about 0.5 and 11.0 µm, said second slot portion has dimensions of between about 0.1 and 0.5 µm by between about 0.5 and 1.0 µm, and said third slot portion has dimensions of between about 0.1 and 0.5 µm by between about 0.9 and 1.5 µm.

11. The method according to claim 1 wherein said slot comprises a first slot portion spaced a first distance from said single isolated via in an X-direction.

12. The method according to claim 11 wherein said slot further comprises a second slot portion spaced a second distance from said single isolated via in a Y-direction wherein a section of said second slot portion contacts a section of said first slot portion for a length defined by a third distance.

13. The method according to claim 11 wherein said first distance is between about 0.1 and 0.4 µm.

14. The method according to claim 12 wherein said second distance is between about 0.3 and 0.5 µm and wherein said third distance is between about 0.1 and 0.5 µm.

15. The method according to claim 11 wherein said first slot portion has a rectangular or a square shape.

16. The method according to claim 11 wherein said first slot portion has dimensions of between about 0.1 and 0.5 µm by between about 0.9 and 1.5 µm.

17. The method according to claim 12 wherein said first and second slot portions have dimensions of between about 0.1 and 0.5 µm by between about 0.9 and 1.5 µm.

18. The method according to claim 1 wherein said slot comprises a first slot portion spaced a first distance from said first single isolated via in a Y-direction.

19. The method according to claim 18 wherein said first distance is between about 0.1 and 0.4 µm.

20. The method according to claim 18 wherein said first slot portion has dimensions of between about 0.1 and 0.5 µm by between about 0.9 and 1.5 µm.

* * * * *